(12) United States Patent
Kang et al.

(10) Patent No.: US 7,772,639 B2
(45) Date of Patent: Aug. 10, 2010

(54) CHARGE-TRAP NONVOLATILE MEMORY DEVICES

(75) Inventors: Chang-Seok Kang, Gyeonggi-do (KR);
Jung-Dal Choi, Gyeonggi-do (KR);
Ju-Hyung Kim, Gyeonggi-do (KR);
Jong-Sun Sel, Gyeonggi-do (KR);
Jae-Sung Sim, Gyeonggi-do (KR);
Sang-Hun Jeon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 300 days.

(21) Appl. No.: 11/700,315

(22) Filed: Jan. 31, 2007

(65) Prior Publication Data

US 2008/0006872 A1    Jan. 10, 2008

(30) Foreign Application Priority Data

Jul. 10, 2006   (KR) .................. 10-2006-0064518

(51) Int. Cl.
*H01L 29/788* (2006.01)
(52) U.S. Cl. .................. 257/321; 257/315; 257/324; 257/E29.129
(58) Field of Classification Search .................. 257/324, 257/E29.129, 315, 321
See application file for complete search history.

(56) References Cited

U.S. PATENT DOCUMENTS

2003/0017671 A1*  1/2003  Lee et al. .................... 438/257
2004/0135194 A1*  7/2004  Lee ............................ 257/315
2004/0251521 A1* 12/2004  Tanaka et al. ............... 257/639

FOREIGN PATENT DOCUMENTS

| JP | 2005-039278 A | 2/2005 |
| JP | 2005-045202 A | 2/2005 |
| KR | 1020020095355 A | 12/2002 |
| KR | 1020050069144 A | 7/2005 |
| KR | 1020050106280 A | 9/2005 |
| KR | 1020060011478 A | 2/2006 |

OTHER PUBLICATIONS

Notice of Allowance for Korean Patent Application No. 2006-64518; Jun. 18, 2007.
English translation of Notice of Allowance for Korean Patent Application No. 2006-64518; Jun. 18, 2007.

* cited by examiner

*Primary Examiner*—Cuong Q Nguyen
*Assistant Examiner*—Trang Q Tran
(74) *Attorney, Agent, or Firm*—Myers Bigel Sibley & Sajovec (57) ABSTRACT

Nonvolatile memory devices including device isolation patterns on a semiconductor substrate are provided. The device isolation patterns define a cell active region and a peripheral active region of the semiconductor substrate. Cell gate electrodes are provided that cross over the cell active regions. Memory cell patterns are provided between the cell gate electrodes and the cell active regions and extend toward the device isolation patterns. A tunnel insulation film is provided between the memory cell pattern and the cell active region. Related methods of fabricating nonvolatile memory devices are also provided herein.

8 Claims, 12 Drawing Sheets

Fig. 1

(PRIOR ART)

Fig. 2

(PRIOR ART)

Fig. 3

(PRIOR ART)

CHARGE-TRAP NONVOLATILE MEMORY DEVICES

CLAIM OF PRIORITY

This application is related to and claims priority from Korean Patent Application No. 2006-64518 filed on Jul. 10, 2006, in the Korean Intellectual Property Office, the disclosure of which is hereby incorporated herein by reference as if set forth in its entirety.

FIELD OF THE INVENTION

The present invention generally relates to semiconductor devices and, more particularly, to charge-trap nonvolatile memory devices and methods of fabricating the same.

BACKGROUND OF THE INVENTION

Nonvolatile memory devices retain information stored thereon when power is removed from the memory device. Nonvolatile memory devices may be classified as, for example, read-only memory (ROM), erasable and programmable ROM (PROM), and electrically erasable and programmable ROM (EEPROM). EEPROMs are typically configured to allow modification of information quickly and easily relative to ROMs or EPROMs. One type of EEPROM is a flash memory device, which is typically highly integrated. Thus, the demand for flash memory devices is rapidly increasing.

Flash memory devices may be classified, for example, as floating-gate and charge-trap types according to a type of charge-storing structure. In particular, a floating-gate flash memory, which is a general type of flash memory, includes unit cells each having sequentially stacked floating and control gate electrodes. Floating-gate flash memory devices may experience technical problems when highly integrated. For example, highly integrated flash memory devices may have increased aspect ratios of gate patterns, increased aspect ratios of gap regions between gate patterns, and increased interference between floating gate electrodes.

Charge-trap flash memory devices are similar in structure to a conventional metal oxide semiconductor field effect transistor (MOSFET) because it uses a film having a plurality of trap sites, such as charge trap layers, instead of the floating gate. Furthermore, as the charge trap films are formed to have thicknesses less than a thickness of the floating gate electrode, the charge-trap flash memory devices may not experience the same problems discussed above with respect to the floating-gate flash memory devices. Thus, charge-trap flash memory devices are becoming more widely used and studied. Charge-trap flash memory devices may have silicon-oxide-nitride-oxide-semiconductor (SONOS) or metal-oxide-nitride-oxide-semiconductor (MONOS) structures using silicon nitride for the charge trap film.

According to recent studies with respect to charge-trap flash memories, however, it has been discovered that charge could spread laterally in a silicon nitride film. Since the condition of data stored in a memory cell is typically dependent on a density of charges trapped in the silicon nitride film, such a lateral spread may degrade retention characteristics of the charge-trap flash memory. Thus, techniques for reducing the likelihood that charges will laterally spread by separating the charge trap film forming each memory cell have been proposed.

SUMMARY OF THE INVENTION

Some embodiments of the present invention provide nonvolatile memory devices including device isolation patterns on a semiconductor substrate. The device isolation patterns define a cell active region and a peripheral active region of the semiconductor substrate. Cell gate electrodes are provided that cross over the cell active regions. Memory cell patterns are provided between the cell gate electrodes and the cell active regions and extend toward the device isolation patterns. A tunnel insulation film is provided between the memory cell pattern and the cell active region.

In further embodiments of the present invention, each memory cell pattern may include a charge trap film, a blocking dielectric film on the charge trap film and a cell electrode on the blocking dielectric film. The charge trap film may include at least one of oxide and nitride films of silicon, metal and metal silicide and polysilicon dots. The blocking dielectric film may include at least one of from insulating materials having a dielectric constant greater than a dielectric constant of silicon nitride. The cell electrode may include at least one of metal, metal silicide and polysilicon.

In still further embodiments of the present invention, the tunnel insulation film may include silicon oxide. The charge trap film may include silicon nitride and the blocking dielectric film may include aluminum oxide. The cell electrode may include tantalum nitride. The cell gate electrode may include tungsten nitride and tungsten layers on the tungsten nitride.

In some embodiments of the present invention, the nonvolatile memory device may include separation patterns between the cell gate electrodes and the device isolation patterns and may be configured to electrically isolate the memory cell patterns from each other.

In further embodiments of the present invention, the memory cell pattern may have a width that is larger than a width of the cell active region.

In still further embodiments of the present invention, the nonvolatile memory device may further include peripheral gate electrodes crossing over the peripheral active regions and a peripheral gate insulation film between the peripheral gate electrodes and the peripheral active regions. The peripheral gate electrode may include polysilicon and the peripheral gate insulation film may have a thickness that is different from a thickness of the tunnel insulation film.

Although embodiments of the present invention are primarily discussed above with respect to nonvolatile memory devices, methods of fabricating nonvolatile memory devices are also provided herein.

BRIEF DESCRIPTION OF THE DRAWINGS

FIGS. 4A through 10A are perspective views illustrating processing steps in the fabrication of charge-trap nonvolatile memory devices on a cell array region in accordance with some embodiments of the present invention.

FIGS. 4B through 10B are perspective views illustrating processing steps in the fabrication of charge-trap nonvolatile memory devices on a peripheral region in accordance with some embodiments of the present invention.

DETAILED DESCRIPTION OF EMBODIMENTS OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various elements, these elements should not be limited by these terms. These terms are only used to distinguish one element from another element.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1:
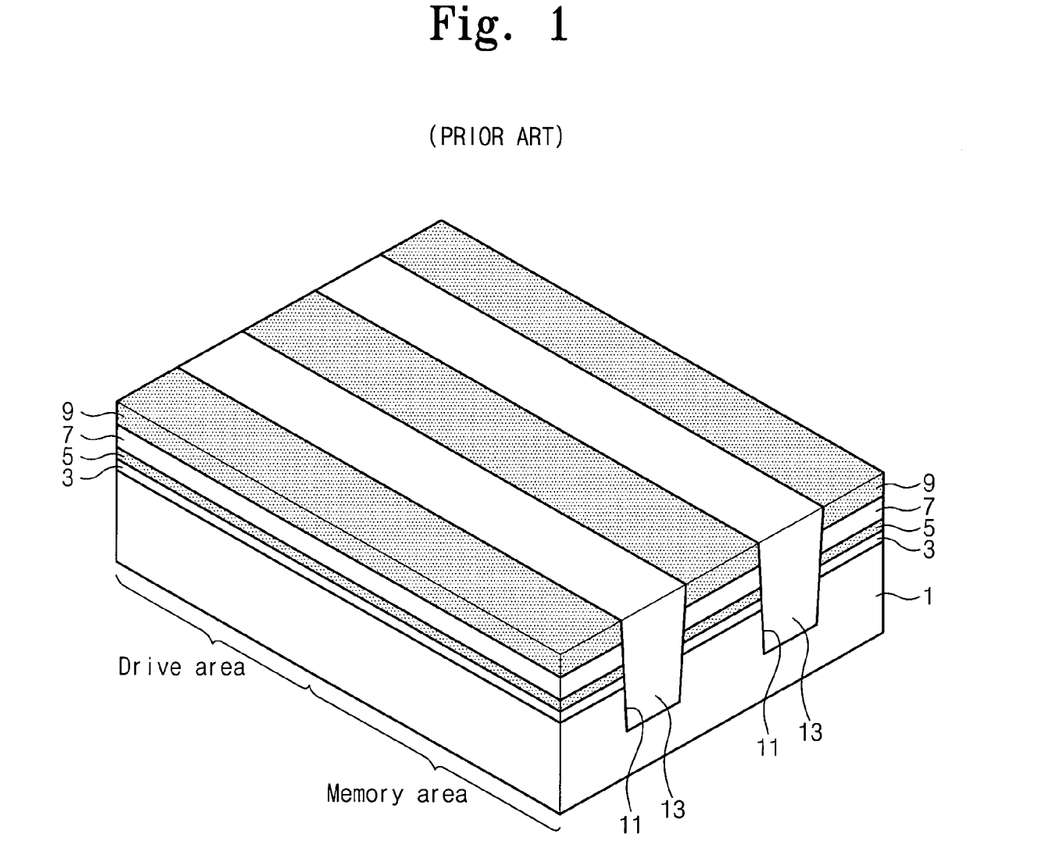
FIGS. 1 through 3 are perspective views illustrating charge-trap nonvolatile memory devices.
Figure 2:
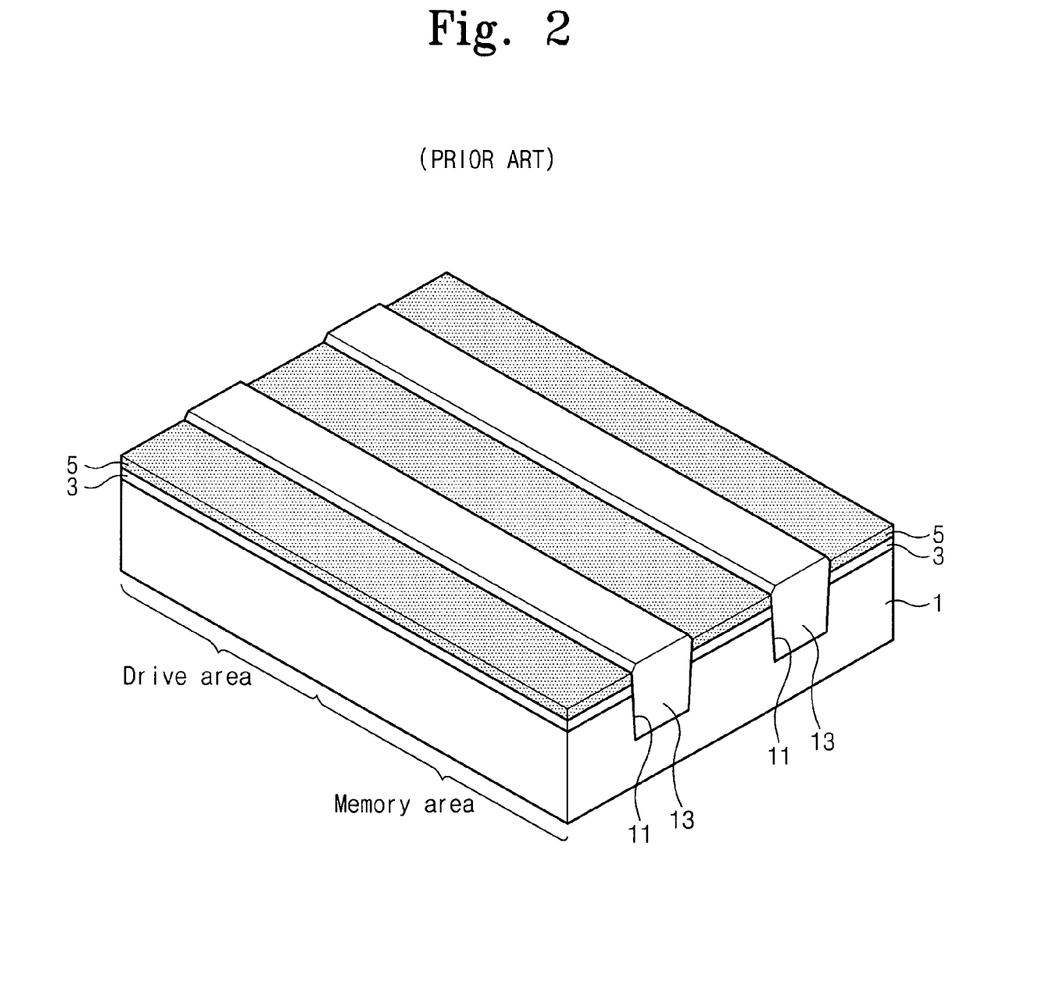
Figure 3:
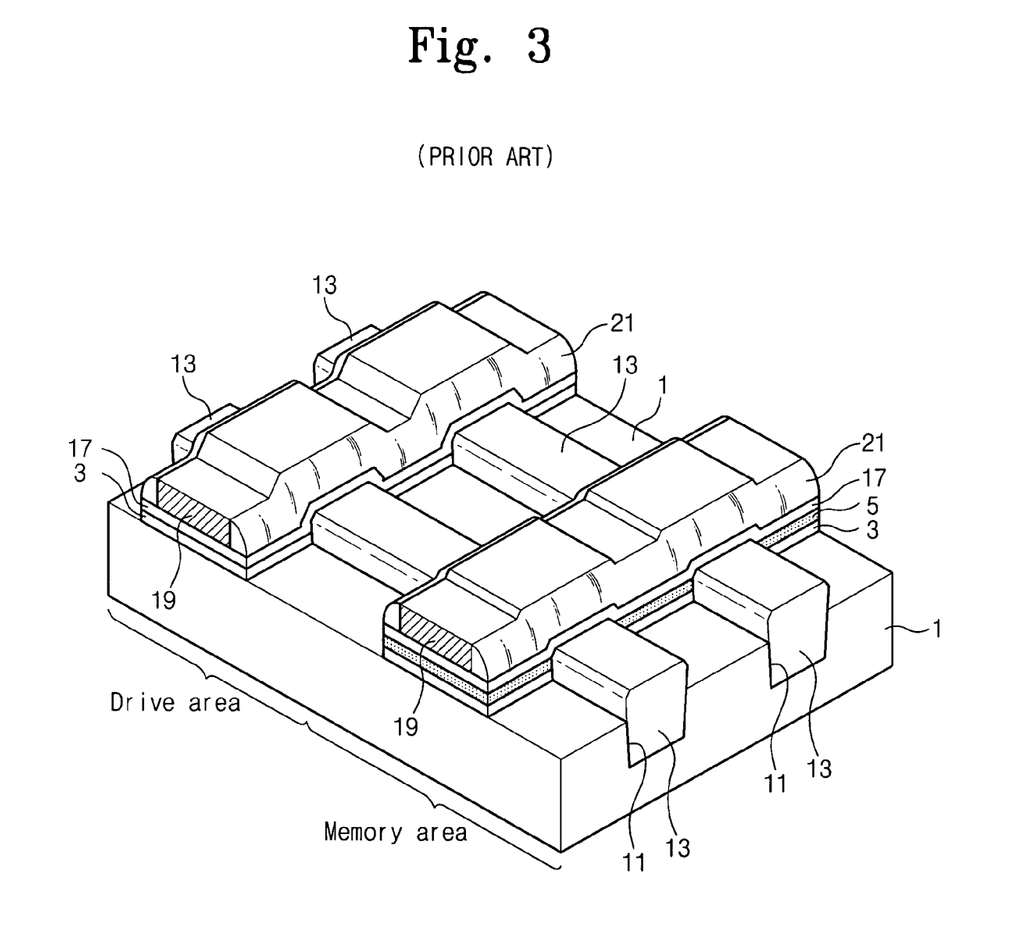

FIGS. 1 through 3 are perspective views illustrating processing steps in the fabrication of charge-trap nonvolatile memory devices including a step of separating a charge trap film while forming a device isolation film. Referring first to FIG. 1, tunnel insulation patterns 3, charge trap patterns 5, protection patterns 7, and mask patterns 9 are sequentially formed on a semiconductor substrate 1 including drive and memory areas. The tunnel trap pattern 3, the charge trap pattern 5, and the mask pattern 9 include silicon oxide, silicon nitride, and medium temperature oxide (MTO), respectively.

Using the mask patterns 9 as an etch mask, the semiconductor substrate 1 is anisotropically etched to form trenches 11 defining active regions and device isolation patterns 13 are formed to fill the trenches 11.

Referring now to FIGS. 2 and 3, the mask patterns 9 and protection patterns 7 are sequentially removed to expose upper surfaces of the charge trap patterns 5. As illustrated in FIG. 3, after removing the charge trap patterns 5 from the drive area, a block dielectric film 17 is formed on the resultant structure of the substrate 1. After forming gate electrodes 19 crossing over the active regions, on the block dielectric film 17, and spacers 21 at both sides of the gate electrodes 19, an etching process using the gate electrodes 19 and the spacers 21 as a mask is carried out to expose at least the upper surfaces of the tunnel insulation patterns 3. As illustrated in FIG. 3, upper surfaces of the active regions and the device isolation pattern 13 may be exposed.

The charge trap patterns 5 are completed by using a doubling etch process carried out in the direction parallel to the device isolation film 13 and the gate electrodes 19 in the memory area. Thus, as illustrated in FIG. 3, the charge trap patterns 5 formed in the configuration of islands separated from each other. As a result, lateral spread of charge may be interrupted thereby.

Furthermore, since the charge trap pattern is a film for storing charges (i.e., data), it has stable physical/chemical characteristics. But, since the process for removing the protection patterns 7 incurs damage on the charge trap patterns, it has been regarded as making it difficult to provide stability required therein.

FIGS. 4A through 10A and 4B through 10B are perspective views illustrating processing steps in the fabrication of charge-trap nonvolatile memory devices in accordance with some embodiments of the present invention. FIGS. 4A through 10A partially illustrate a cell array region of the device and FIGS. 4B through 10B partially illustrate a peripheral region of the device.

Figure 4A:
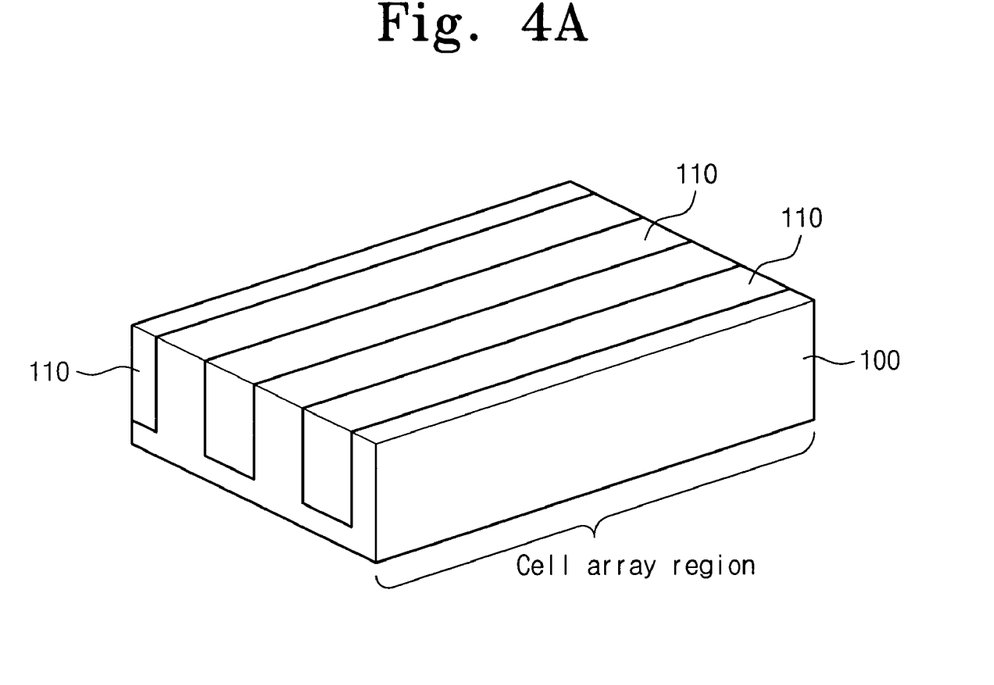
Figure 4B:
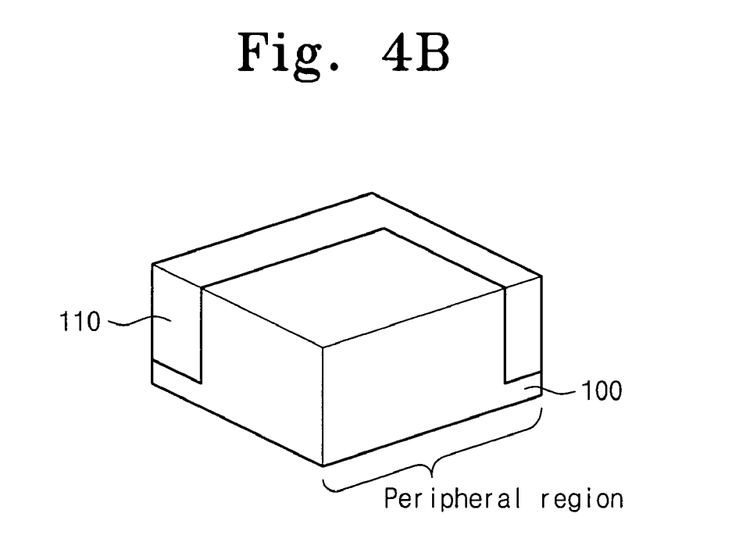

Referring to FIGS. 4A and 4B, device isolation patterns 110 are formed to define active regions in a semiconductor substrate 100. A memory device includes a cell array region in which memory cell transistors are arranged, and a peripheral region in which peripheral transistors are arranged with connection to the cell transistors. In some embodiments of the present invention, the active regions may be divided into cell active regions formed in the cell array region, and peripheral active regions formed in the peripheral region.

According to some embodiments of the present invention, the cell active regions, as shown in FIG. 4A, are formed in parallel with each other. For this arrangement, the device isolation patterns 110 are also formed in parallel with each other. Otherwise, a configuration of the peripheral active regions is variable. According to further embodiments of the present invention, the cell active regions may be formed in other patterns different from that shown in FIG. 4A without departing from the scope of the present invention.

The device isolation patterns 110 may be formed by, for example, one of shallow trench isolation processes known in the art. For example, a step of forming the device isolation patterns 110 may be carried out by including a process of anisotropically etching the semiconductor substrate 100 under an etch mask after arranging a trench mask pattern on the active regions. The etching process may result in trenches defining the active regions around the trench mask pattern. Thereafter, a device isolation film is formed to fill the trenches and then etched away until exposing the trench mask pattern, resultantly forming the device isolation patterns 110. The trench mask pattern is removed to expose the upper surfaces of the active regions.

According to some embodiments of the present invention, the trench mask pattern is not used as a charge trap film and is removed after forming the device isolation patterns 110. The trench mask pattern according to some embodiments of the present invention is differentiated from the trench mask pattern 5 illustrated in FIG. 1.

Figure 5A:
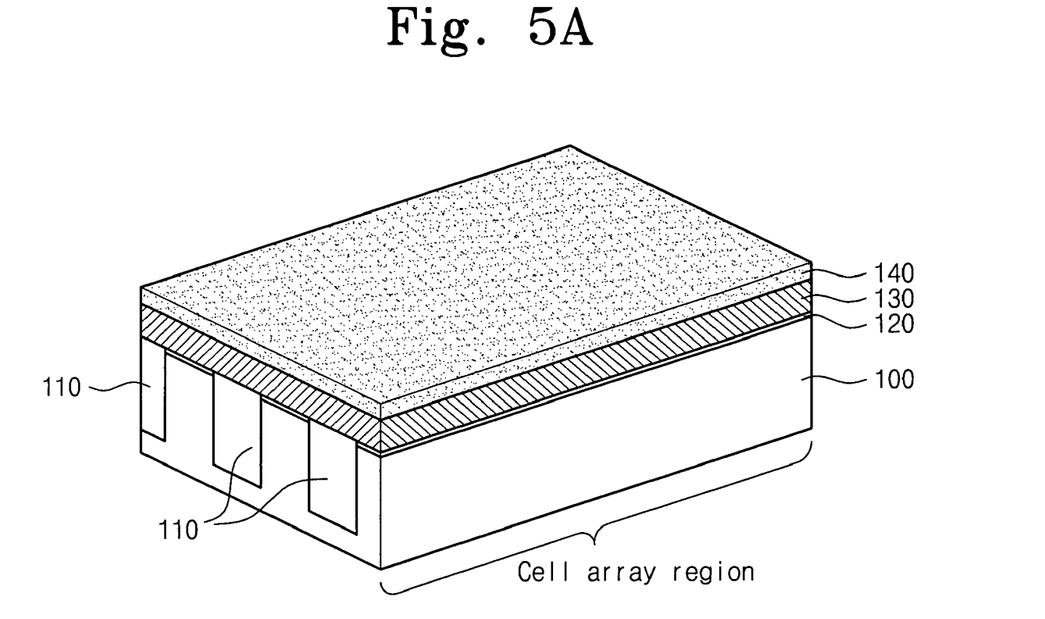
Figure 5B:
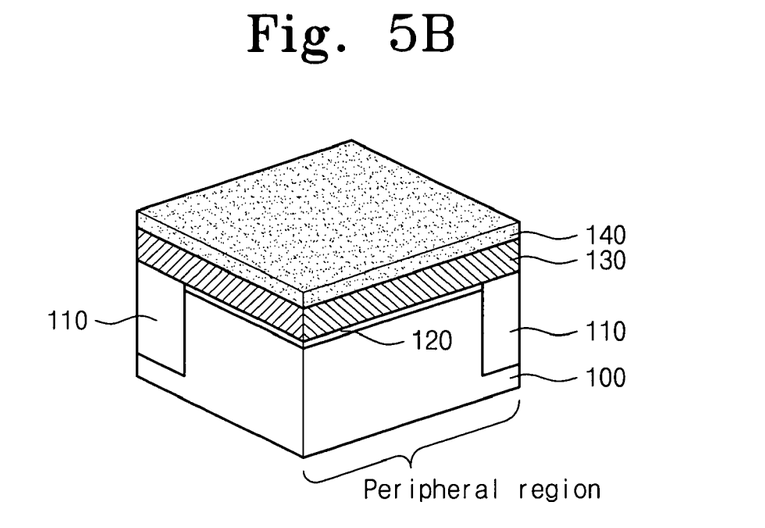

Referring now to FIGS. 5A and 5B, a gate insulation film 120 is deposited to cover the active regions. The gate insulation film 120 may be, for example, a silicon oxide film formed by thermal oxidation. In some embodiments of the present invention, as illustrated in FIGS. 5A and 5B, the gate insulation film 120 is formed on the upper surfaces of the active regions. According to some embodiments of the present invention, the gate insulation film 120 may include one or more of insulation films formed by way of deposition. The gate insulation film 120 may be formed all over the semiconductor substrate 100.

On the resultant structure including the gate insulation film 120, the first conductive film 130 and the first mask film 140 are deposited in sequence. The first conductive film 140 is used as a material for gate electrodes of the peripheral transistors. According to some embodiments of the present invention, the first conductive film 130 may be, for example, a polysilicon film containing N-type impurities. Furthermore, the first mask film 140 may include, for example, silicon nitride, and may be used as an etch mask for patterning the first conductive film 130 in a subsequent process.

Figure 6A:
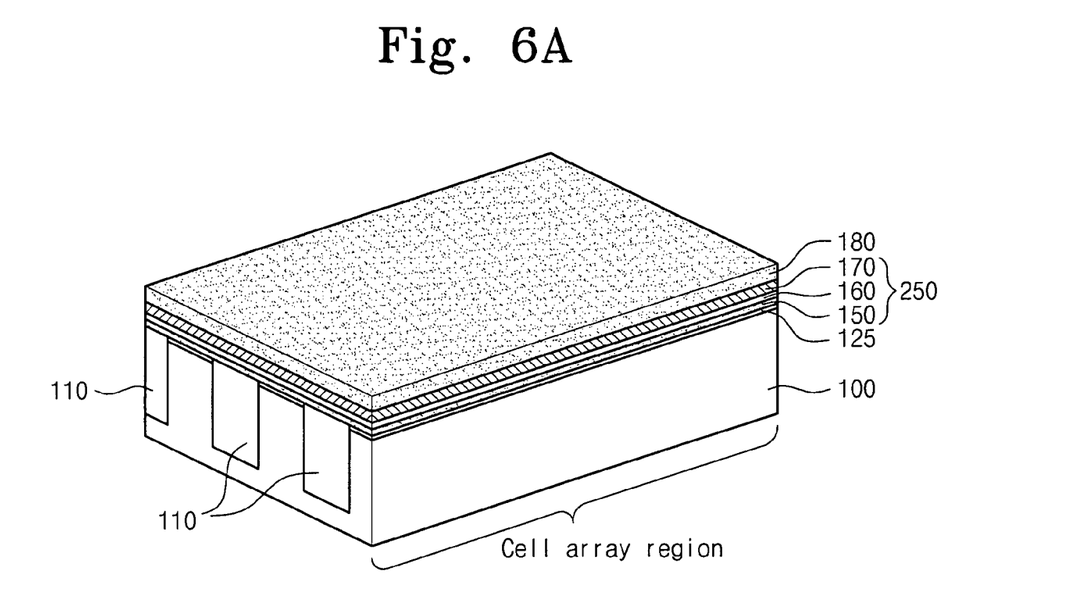
Figure 6B:
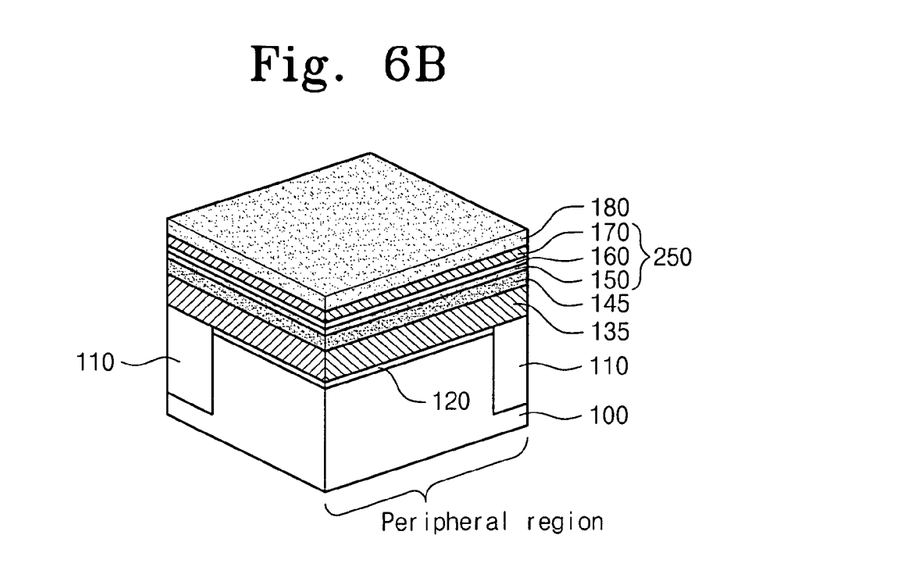

Referring now to FIGS. 6A and 6B, the first mask film 140 and the first conductive film 130 are patterned to form a first mask pattern 145 and a first conductive pattern 135 which expose the cell array region. In particular, the first conductive pattern 135 and the first mask pattern 145 are disposed just over the peripheral region. An etch mask for the patterning process may be used with a photoresist pattern (not shown) covering the peripheral region while exposing the cell array region.

The gate insulation film 120 is removed from the exposed cell array region, exposing the upper surfaces of the cell active regions. As discussed above, when the gate insulation film 120 is formed of silicon oxide, this step may use fluoric acid as an etchant. The gate insulation film 120 in the peripheral region is not etched because it is covered by the first conductive pattern 135.

A tunnel insulation film is formed to cover the upper surfaces of the exposed cell active regions. According to some embodiments of the present invention, the tunnel insulation film 125 may include, for example, silicon oxide or silicon oxynitride. In some embodiments, the tunnel insulation film 125 may include, for example, a silicon oxide film formed by thermal oxidation, having a thickness smaller than that of the gate insulation film 120 remaining in the peripheral region. In further embodiments of the present invention, the tunnel insulation film 125 may be a silicon oxynitride film formed by chemical vapor deposition. In this case, the tunnel insulation film 125 may be deposited all over the semiconductor substrate 100. Embodiments of the present invention using a thermal oxide as the tunnel insulation film 125 will be discussed further herein.

A preliminary gate film 250 is deposited all over the resultant structure including the tunnel insulation film 125. The preliminary gate film 250 may be formed including a charge trap film 150, a blocking dielectric film 160, and a cell electrode film 170 which are stacked in sequence. Furthermore, on the preliminary gate film 250 a second mask film 180 may be formed to be used as an etch mask in the subsequent patterning process.

The charge trap film 150 may include, for example, one selected from materials that have chemical structures such as MwSixOyNz (M: metal, Si: silicon, O: oxygen, N: nitrogen). For example, the charge trap film 150 may be formed of one or more materials selected from oxides or nitrides of silicon, metal, and metal silicide. On the other hand, according to the present invention, the charge trap film 150 may be further comprised of conductive polysilicon dots arranged on the tunnel insulation film 125 in second dimensions. Each of the conductive polysilicon dots may be formed having a diameter of several or several hundreds angstroms. The conductive polysilicon dots may be used as structures for storing charges and improving uniformity of gate voltages.

The blocking dielectric film 160 may include, for example, one or more materials selected from materials larger than silicon nitride in dielectric constant. For example, the blocking dielectric film 160 may be one of high-k dielectrics, such as aluminum oxide, hafnium oxide, hafnium aluminum oxide, zirconium oxide, and the like.

The cell electrode film 170 may include, for example, one or more materials selected from metal, metal nitride, metal silicide, and polysilicon. In particular, the cell electrode film 170 may include, for example, one selected from tantalum silicide (TaN), titanium nitride (TiN), and tungsten nitride (WN). Furthermore, a nitride film for the cell electrode film 170 may be doped with carbon as impurities.

The second mask film 180 may include, for example, one or more materials selected from silicon nitride, silicon oxide, and silicon oxynitride. According to some embodiments of the present invention, the second mask film 180 may include the same material with the first mask pattern 145.

In particular, according to some embodiments of the present invention, the cell electrode film 170, the blocking dielectric film 160, and the charge trap film 150 may include, for example, tantalum nitride, aluminum oxide, and silicon nitride, respectively. The charge trap nonvolatile memory device with such a structure is referred to as a TANOS (Si-Oxide-SiN—Al2O3-TaN) flash memory device.

Figure 7A:
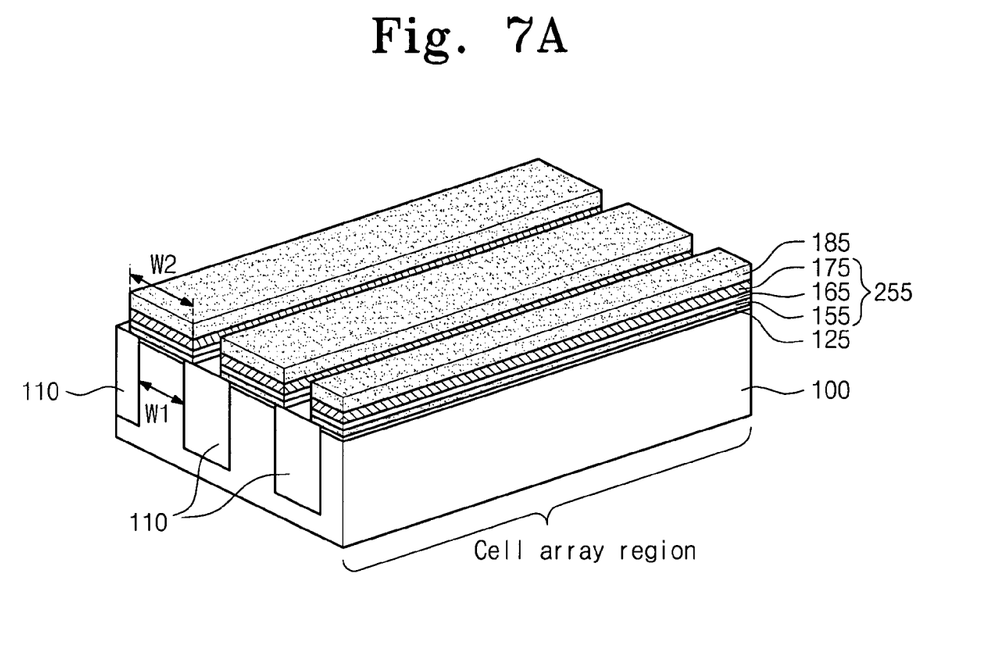
Figure 7B:
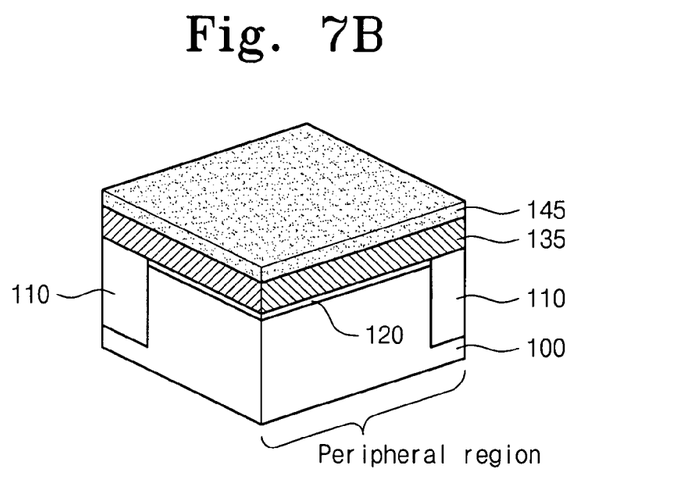

Referring now to FIGS. 7A and 7B, the second mask film 180 and the preliminary gate film 250 are patterned to form a preliminary gate pattern 255 and a second mask pattern 185 which cover the cell active regions in sequence. The preliminary gate pattern 255 results from patterning the preliminary gate film 250, being formed of a preliminary charge trap pattern 155, a preliminary blocking dielectric pattern 165, and a preliminary cell electrode 175. According to some embodiments of the present invention, during this step, the second mask film 180 and the preliminary gate film 250 are removed from the peripheral region. Thus, as illustrated in FIGS. 7A and 7B, the upper surface of the first mask pattern 145 remaining in the peripheral region is exposed and the preliminary gate pattern 255 and the second mask pattern 185 locally remain in the cell array region.

According to some embodiments of the present invention, the preliminary gate pattern 255 is disposed over the cell active region, having a width W2 larger than a width W1 of the cell active filed (W2>W1). Thus, the preliminary gate pattern 255, as illustrated in FIGS. 7A and 7B, is formed to cover the top edges of the device isolation patterns 110 adjacent to each other. Namely, the centers of the device isolation patterns 110 are exposed by the preliminary gate patterns 255.

Figure 8A:
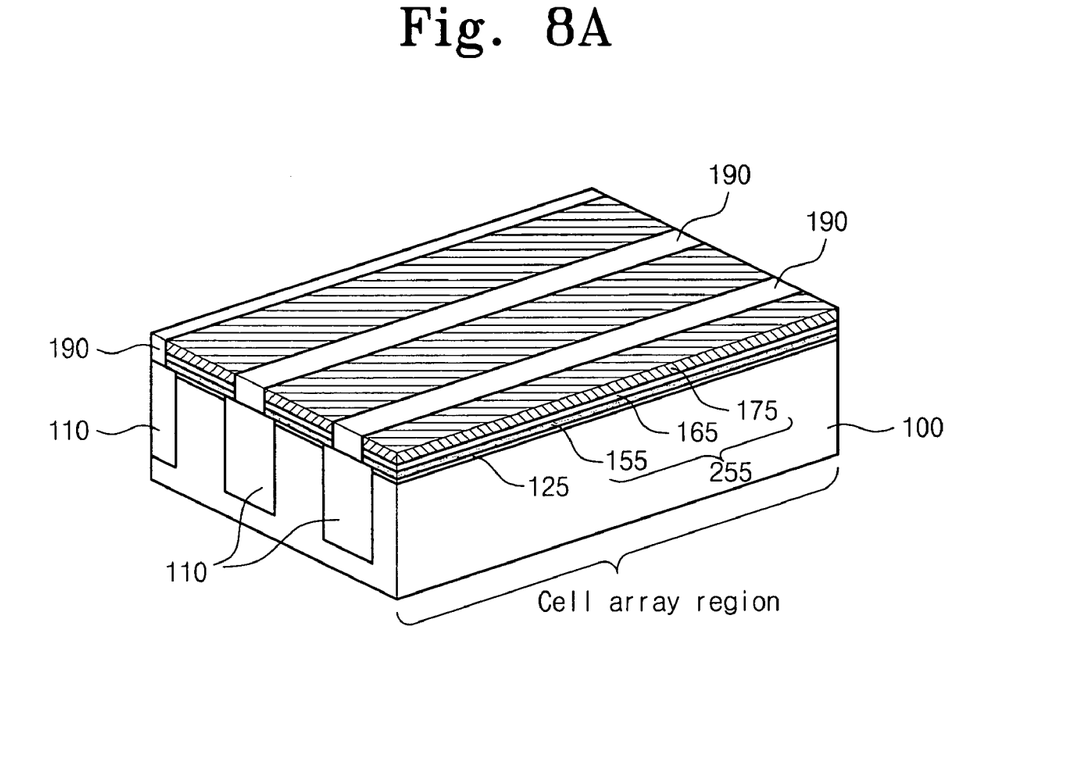
Figure 8B:
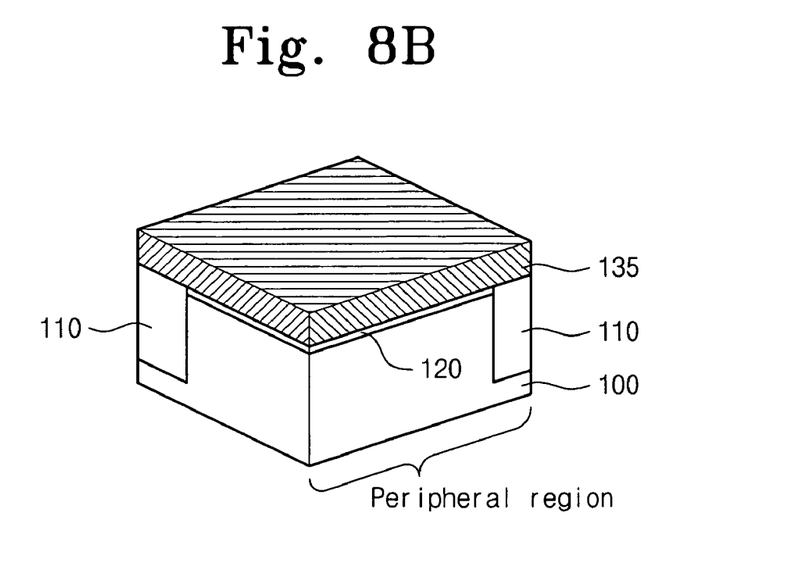

Referring now to FIGS. 8A and 8B, a separation dielectric film is formed on the resultant structure including the preliminary gate patterns 255. According to some embodiments of the present invention, the separation dielectric film may include, for example, silicon oxide formed by chemical vapor deposition. The separation dielectric film is etched away until upper surfaces of the first and second mask patterns 145 and 185 are exposed each in the peripheral and cell array regions. As a result, a separation dielectric pattern 190 is formed to fill gap regions between the preliminary gate patterns 255.

The exposed first and second mask patterns 145 and 185 are removed to expose the upper surfaces of the preliminary gate pattern 255 and the first conductive pattern 135. As discussed above, since the highest layer of the preliminary gate pattern 255 includes the preliminary cell electrode 175, the charge trap pattern 155 and the preliminary blocking dielectric pattern 165 may be free from etch damages even during the process for removing the first and second mask patterns 145 and 185. Furthermore, since the separation dielectric pattern 190 is formed between the preliminary gate patterns 255, the sides of the preliminary charge trap pattern 155 and the preliminary block dielectric pattern 165 are protected from etch damage while removing the first and second mask patterns 145 and 185.

Figure 9A:
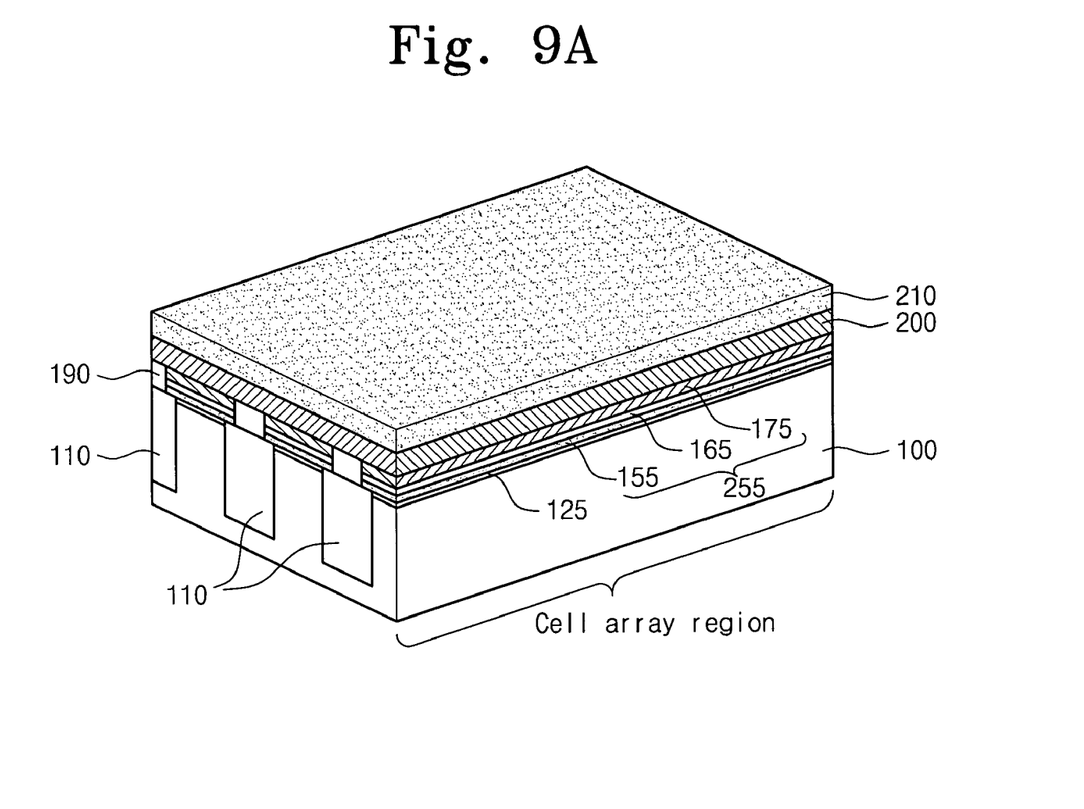
Figure 9B:
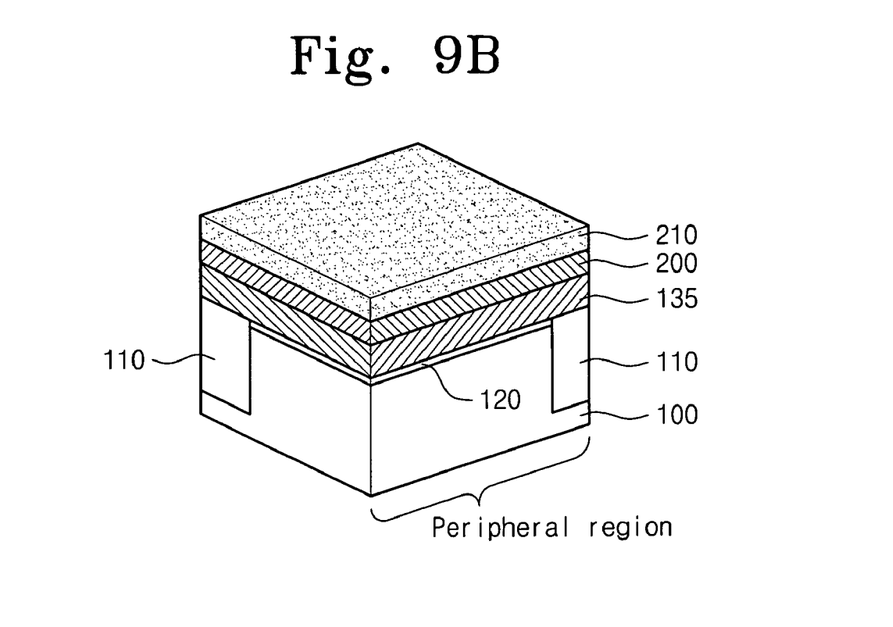

Referring now to FIGS. 9A and 9B, after removing the first and second mask patterns 145 and 185, a gate metal film 200 and a third mask film 210 are deposited on the resultant structure in sequence. Thereby, the preliminary gate pattern 255 and the first conductive pattern 135 directly contact with the gate metal film 200.

According to some embodiments of the present invention, the gate metal film 200 may include tungsten nitride and tungsten layers which are stacked in sequence. The third mask film 210 may be formed of silicon nitride, silicon oxide, or silicon oxynitride.

Figure 10A:
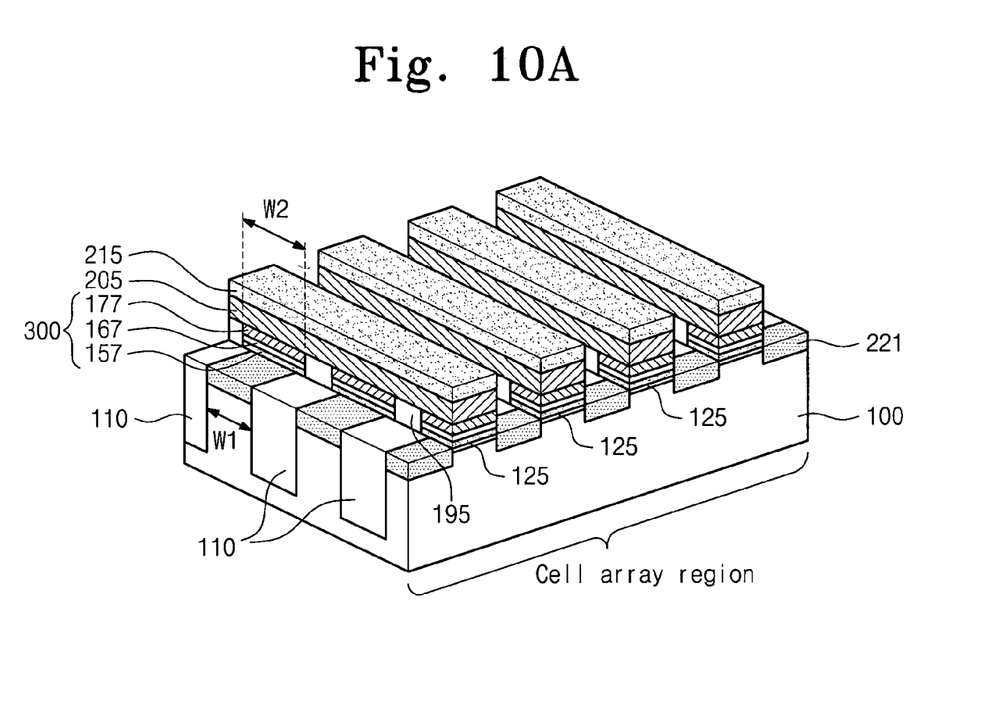
Figure 10B:
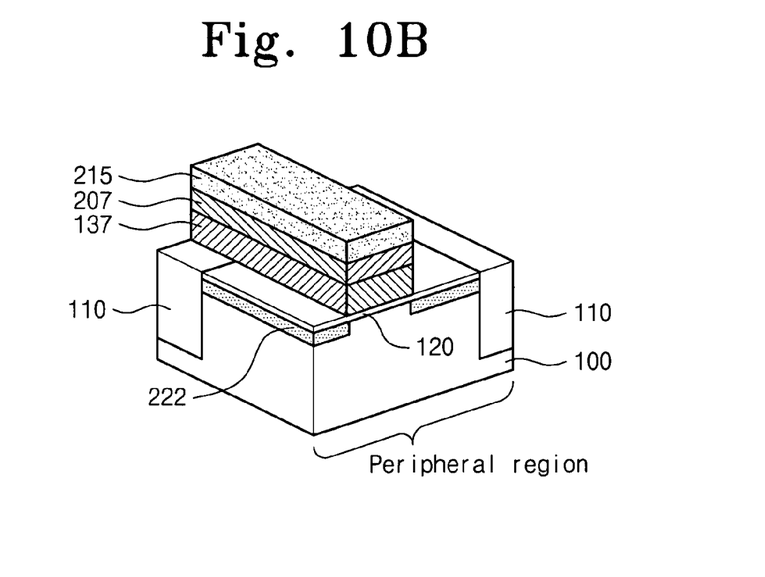

Referring to FIGS. 10A and 10B, the third mask film 210 is patterned to form third mask patterns 215 crossing over the active regions. Subsequently, using the third mask patterns 215 as an etch mask, it anisotropically etches the gate metal film 200, the preliminary gate patterns 255, the separation dielectric pattern 190, and the first conductive pattern 135.

As illustrated in FIG. 10A, cell gate electrodes 205 are formed in the cell array region to cross over the cell active regions. Furthermore, memory cell patterns 300 are formed between the cell gate electrodes 205 and the cell active regions and between the cell gate electrodes 205 and the device isolation patterns 110 are formed separation patterns 195 to electrically isolate the memory cell patterns from each other. As a result of this patterning process, as illustrated in FIG. 10B, a peripheral gate pattern is arranged in the peripheral region to cross over the peripheral active region. The peripheral gate pattern may include, for example, peripheral lower and upper gate electrodes 137 and 207, which results from patterning the first conductive pattern 135 and the gate metal film 200.

The memory cell patterns 300 result from patterning the preliminary gate patterns 255, each memory cell pattern being made up with a charge trap pattern 157, a blocking dielectric pattern 167, and a cell electrode 177 which are stacked in sequence. As the memory cell patterns 300 and the cell gate electrodes 205 are formed by means of the same etch mask (i.e., the third mask patterns 215), they are arranged in self-alignment. Thus, as discussed above, since the preliminary gate pattern 255 is larger than the cell active region in width, the memory cell pattern 300 is also larger than the cell active region in width (i.e., W2>W1).

Using the third mask pattern 215 as a mask, an ion implantation process is carried out to form cell and peripheral impurity regions, 221 and 222, each in the cell and peripheral active regions. According to some embodiments of the present invention, it is permissible to make the cell and peripheral impurity regions, 221 and 222, different from each other in kind and concentration of impurities. For this differentiation, the impurity regions 221 and 222 may be formed each through independent ion implantation processes from each other. Furthermore, a process of halo ion implantation may be further carried out to improve characteristics of cell or peripheral transistors.

In the meantime, to possible improve or even cure etch damages arising from forming the cell gate electrodes 205 and the peripheral gate patterns, a process of gate oxidation may be further carried out after forming them. This gate oxidation is conducted in temperature of 800~950° C.

FIGS. 11 through 14 are perspective views illustrating processing steps in the fabrication of charge-trap nonvolatile memory devices in accordance with some embodiments of the present invention. Except that memory cell patterns are formed by one patterning process, this embodiment is similar to embodiments discussed above with respect to FIGS. 4A through 10B. Thus, details discussed above with respect to FIGS. 4A through 10B will not be repeated herein in the interest of brevity. Processing steps similar to those discussed above with respect to 4A through 6A and 4B through 6B are also performed in embodiments illustrated in FIGS. 11 through 14.

Figure 11:
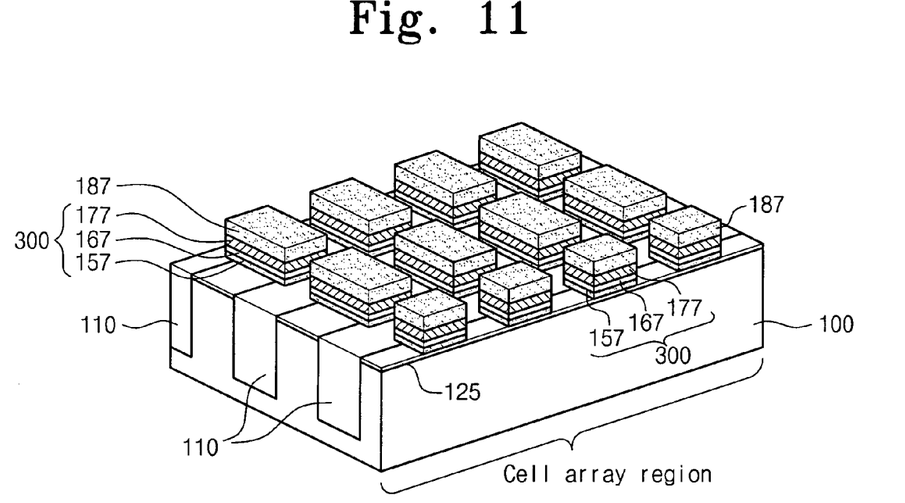
FIGS. 11 through 14 are perspective views illustrating charge-trap nonvolatile memory devices in accordance with some embodiments of the present invention.

Referring now to FIGS. 6A, 6B, and 11, the second mask film 180 is patterned to form the second mask patterns 187 shaped in islands. Using the second mask patterns 187 as an etch mask, as illustrated in FIG. 11, the preliminary gate film 250 is selectively etched to form memory cell patterns 300 that are arranged in the shape of islands over the cell active regions. As discussed above with respect to FIG. 6A, the memory cell patterns 300 are disposed over the cell active regions, being larger than the cell active regions in width (i.e., W2>W1). Furthermore, as discussed above with respect to FIG. 6B, the second mask film 180 and the preliminary gate film 250 are removed from the peripheral region, exposing the upper surface of the first mask pattern 145.

According to some embodiments of the present invention, it is permissible to further conduct the process of gate oxidation after forming the memory cell patterns 300. According to these embodiments, since the peripheral region is covered by the first conductive film, the gate oxidation process typically just affects the memory cell patterns 300 formed on the cell array region.

Figure 12:
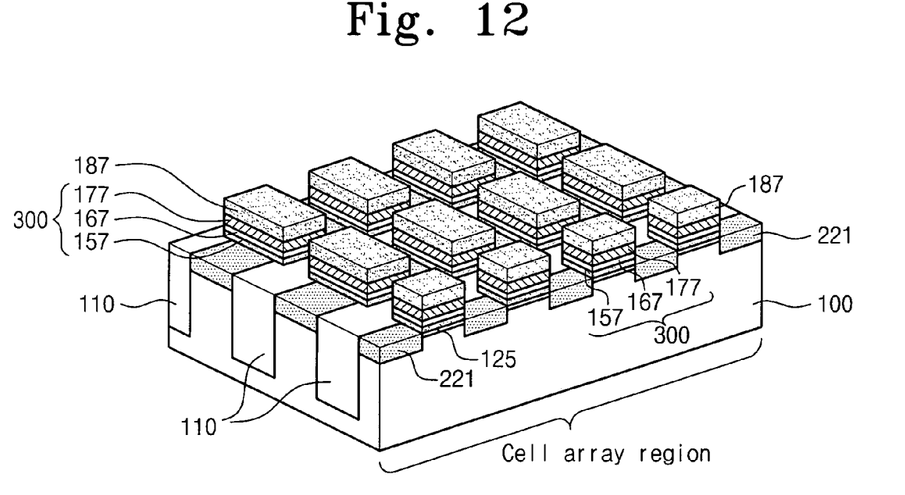
Figure 13:
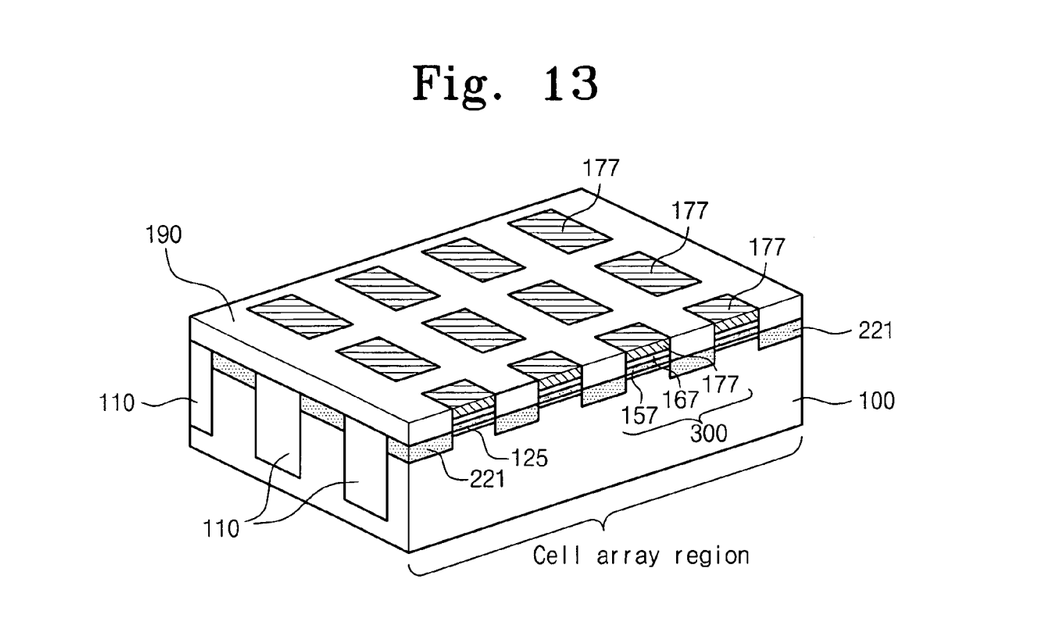

Referring now to FIGS. 12 and 13, using the resultant structure, which includes the memory cell patterns 300, as an ion implantation mask, the cell impurity regions 221 are formed in the cell active regions. The separation dielectric patterns 190 are formed among the memory cell patterns 300. This step of forming the separation dielectric patterns 190 may be conducted in a manner similar to the process discussed above with respect to FIG. 8A.

Figure 14:
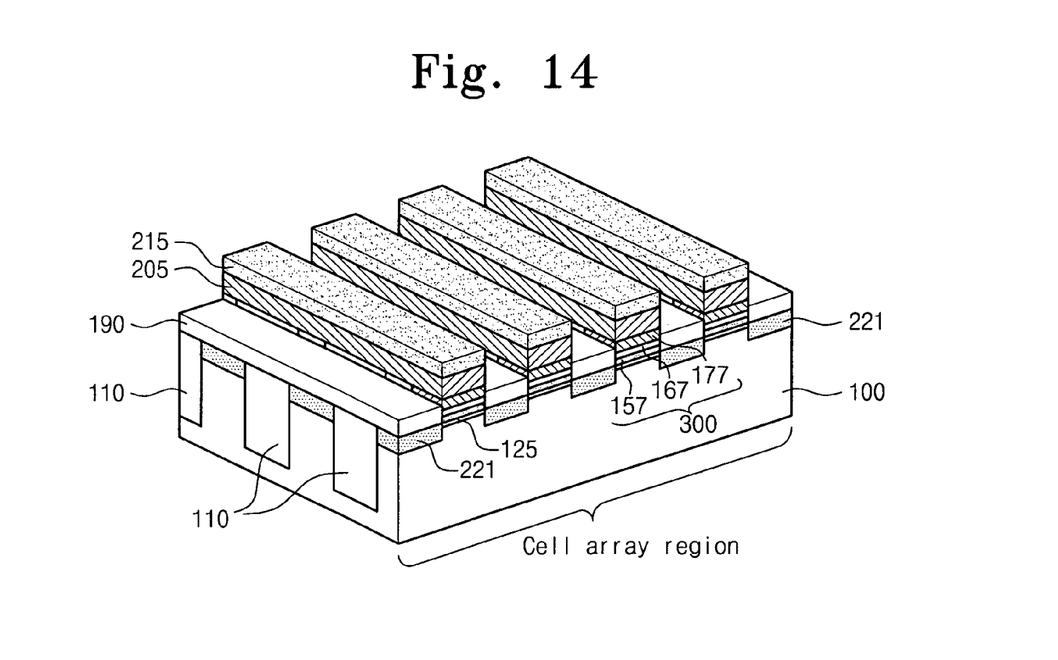

Referring now to FIG. 14, after depositing the gate metal film 200 and the third mask film 210 on the resultant structure including the separation dielectric patterns 190, the gate metal film 200 and the third mask film 210 are sequentially patterned to form the cell gate electrodes 205 and the third mask patterns 215 which are sequentially stacked and cross over the active regions. Here, the cell gate electrodes 205 directly contact with cell electrodes 177 of the memory cell patterns 300 thereunder. According to some embodiments of the present invention, the first conductive film of the peripheral region may be patterned while forming the cell gate electrodes 205, resulting in peripheral gate patterns for gate electrodes of the peripheral transistors.

Memory cells of the nonvolatile memory device according to some embodiments of the present invention may include memory cell patterns isolated from each other in structure. Thus, degradation of functional reliability may be decreased or even prevented due to lateral diffusion of charges. Moreover, according to some embodiments of the present invention, since the memory cell patterns are formed on the resultant structure including device isolation patterns, it may be possible to reduce the likelihood or even prevent damages of charge trap patterns while removing an etch mask.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A nonvolatile memory device comprising:
   device isolation patterns on a semiconductor substrate and defining a cell active region and a peripheral active region of the semiconductor substrate;
   cell gate electrodes crossing over the cell active region, wherein each of the cell gate electrodes are physically separated from each other;
   each of the memory cell patterns between each of the cell gate electrodes and the cell active region, the memory cell patterns extending toward the device isolation patterns to cover top edges of the device isolation patterns and to expose centers of the device isolation patterns; and
   a tunnel insulation film between the memory cell patterns and the cell active region.

2. The nonvolatile memory device of claim 1, wherein each memory cell pattern comprises a charge trap film, a blocking dielectric film on the charge trap film and a cell electrode on the blocking dielectric film.

3. The nonvolatile memory device of claim 2:
   wherein the charge trap film comprises at least one of oxide and nitride films of silicon, metal and metal silicide and polysilicon dots;
   wherein the blocking dielectric film comprises at least one of from insulating materials having a dielectric constant greater than a dielectric constant of silicon nitride; and
   wherein the cell electrode comprises at least one of metal, metal silicide and polysilicon.

4. The nonvolatile memory device of claim 2:
   wherein the tunnel insulation film comprises silicon oxide;
   wherein the charge trap film comprises silicon nitride;
   wherein the blocking dielectric film comprises aluminum oxide;
   wherein the cell electrode comprises tantalum nitride; and
   wherein each of the cell gate electrode comprises tungsten nitride and tungsten layers on the tungsten nitride.

5. The nonvolatile memory device of claim 1, further comprising separation patterns between the cell gate electrodes and the device isolation patterns, the separation patterns being configured to electrically isolate the memory cell patterns from each other.

6. The nonvolatile memory device of claim 1, wherein each of the memory cell patterns has a width that is larger than a width of each cell active region.

7. The nonvolatile memory device of claim 1, further comprising:
   peripheral gate electrodes crossing over the peripheral active regions; and
   a peripheral gate insulation film between the peripheral gate electrodes and the peripheral active regions.

8. The nonvolatile memory device of claim 7, wherein the peripheral gate electrode comprises polysilicon and wherein the peripheral gate insulation film has a thickness that is different from a thickness of the tunnel insulation film.

* * * * *